United States Patent [19]

Yang

[11] Patent Number: 5,723,873

[45] Date of Patent: Mar. 3, 1998

[54] BILAYER COMPOSITE ELECTRODES FOR DIODES

[76] Inventor: Yang Yang, 260 Harvard La., Santa Barbara, Calif. 93111

[21] Appl. No.: 205,519

[22] Filed: Mar. 3, 1994

[51] Int. Cl.$^6$ .............................. H01L 35/24; H01L 51/00
[52] U.S. Cl. .............................. 257/40; 257/10; 257/82; 257/84; 257/734
[58] Field of Search .............................. 257/40, 103, 82, 257/85, 482, 496, 84, 3, 10, 7, 22, 77, 95, 734

[56] References Cited

U.S. PATENT DOCUMENTS

| | | | |
|---|---|---|---|
| 4,539,507 | 9/1985 | VanSlyke et al. | 257/81 |
| 5,142,343 | 8/1992 | Hosokawa et al. | 257/82 |
| 5,189,136 | 2/1993 | Wudl et al. | 528/86 |
| 5,232,631 | 8/1993 | Cao et al. | 252/500 |
| 5,317,169 | 5/1994 | Nakano et al. | 257/40 |
| 5,331,180 | 7/1994 | Yamada et al. | 257/95 |
| 5,352,906 | 10/1994 | Shinar et al. | 257/40 |
| 5,504,323 | 4/1996 | Heeger et al. | 257/85 |

OTHER PUBLICATIONS

Burroughs et al., "Light–emitting diodes based on conjugated polymers" *Nature* (1990) 347:539–541.

Braun et al., "Visible light emission from semiconducting polymer diodes" *Appl. Phys. Lett.* (1991) 58:1982–1984.

Gustafsson et al., "Flexible light–emitting diodes made from soluble conducting polymers" *Nature* (1992) 357:477–479.

Aratani et al., "Improved efficiency in polymer light–emitting diodes using air–stable electrodes" *J. Electron. Mater.* (1993) 22:745–749.

Cao et al., "Solution–cast films of polyaniline: Optical–quality transparent electrodes" *Appl. Phys. Lett.* (1992) 60:2711–2713.

Green et al., *J. Chem. Soc.* (1912) "Aniline–black and allied compounds, Part II" 101:1117.

Kobayashi et al., "Electrochemical reactions concerned with electrochromism of polyaniline film–coated electrodes" *J. Electroanal. Chem.* (1984) 177:281–291.

Zhang et al., "Blue electroluminescent diodes utilizing blends of poly(p–phenylphenylene vinylene) in poly(9–vinylcarbazole)" *Synth. Met.* (1994) 62:35–40.

Zhang et al., "Light–emitting diodes from partially conjugated poly(p–phenylene vinylene)" *J. Appl. Phys.* (1993) 73:5177–5180.

Sariciftci et al., "Semiconducting polymer–buckminsterfullerene heterojunctions: Diodes, photodiodes, and photovoltaic cells" *Appl. Phys. Lett.* (1993) 62:585–587.

Cao et al., "Counter–ion induced processibility of conducting polyaniline" *Synth. Met.* (1993) 55–57:3514–3519.

Wudl et al., "Polymers and an unusual molecular crystal with nonlinear optical properties" *Materials for Nonlinear Optics: Chemical Perpectives*, Amer. Chem. Soc., Washington, D.C., S.R. Marder et al., eds., (1991) 46:683–686.

*Primary Examiner*—Carl W. Whitehead, Jr.
*Attorney, Agent, or Firm*—Burns, Doane, Swecker & Mathis LLP

[57] ABSTRACT

An ohmic hole injecting electrode or contact for diode structures is disclosed. It is formed of multilayer composite materials and gives superior results in this application. The composite materials include a layer of a high work function inorganic material and a layer of conductive polyaniline ("PANI"). In preferred embodiments, the anode has substantial transparency. These preferred materials can function as transparent electrodes in light-related diodes such as LEDs and photovoltaic cells where they exhibit lower turn on voltages and higher efficiencies.

33 Claims, 6 Drawing Sheets

BILAYER COMPOSITE ELECTRODES FOR DIODES

FIELD OF THE INVENTION

This invention relates generally to diodes and the electrodes employed in them. In preferred applications, it relates to the electrodes employed in light-emitting diodes (LEDs) with special emphasis on electrodes employed in LEDs which have semiconducting (conjugated) organic polymer active layers.

BACKGROUND OF THE INVENTION

Solid-state diodes may be found in a variety of applications ranging from photovoltaic cells and LEDs to rectifying diodes, zenor diodes and like devices in electronic circuitry. As illustrated in FIG. 1, solid state diodes such as diode 100 typically have at least one solid state body 102 which is contacted on opposite sides by a pair of contact layer electrodes, one an ohmic hole-injecting electrode (i.e. an anode) 104 and the other an electron-injecting electrode (i.e. a cathode) 106. The diode is often carried on a support or substrate 108 which is present to assure the physical integrity of the diode. The material of the solid state body 102 is selected with the ultimately desired properties of the diode in mind so as to provide the desired light emission, photovoltaic effect, rectification, or the like.

Diodes are in wide use. In the case of LEDs, as an example, they have found widespread application in displays, as well as in a variety of less common applications. An LED typically has the above-described three elements—an active light-emitting layer bounded on one side by the ohmic hole-injecting electrode (i.e. an anode) layer 104, which in the case of LED's is usually at least partially transparent, and on the other by an electron-injecting electrode (i.e. a cathode) 106. In this case, the substrate 108 is transparent. Alternatively, the positions of electrodes 104 and 106 can be reversed.

Classically, LEDs and other diodes are fabricated with these various layers made from conventional inorganic semiconductors; for example, gallium arsenide (GaAs), typically doped with aluminum, indium, or phosphorus. In the case of LEDs these materials have had limitations. It is often difficult to make large area displays. In addition, the LEDs made of these materials are typically limited to the emission of light at the long wavelength end of the visible spectrum. For these reasons, there has been considerable interest for many years in the development of suitable organic materials for use as the active (light-emitting) components of LEDs. Similarly, organic materials are being explored in other diode structures, as well.

Diodes, and particularly LEDs, fabricated with conducting organic polymer active layers (H. Burroughs, D. D. C. Bradley, A. R. Brown, R. N. Marks, K. Mackay, R. H. Friend, P. L. Burns and A. B. Holmes, Nature 347, 539 (1990); D. Braun and A. J. Heeger, Appl. Phys. Lett. 58, 1982 (1991)) have attracted attention due to their potential for use in display technology. (These references as well as all the additional articles, patents and patent applications referenced herein are incorporated by reference.) Among the promising materials for use as active layers in polymer LEDs is poly(2-methoxy-5-(2'-ethyl-hexyloxy)-1,4- phenylene vinylene), MEH-PPV, a semiconducting polymer with an energy gap $E_g$ of ~2.1 eV. This material is described in more detail in U.S. Pat. No. 5,189,136. Another material described as useful in this application is poly(2,5-bis (cholestanoxy)-1,4-phenylene vinylene) (BCHA-PPV), a semiconducting polymer with an energy gap $E_g$ of ~2.2 eV. This material is described in U.S. patent application Ser. No. 07/800,555. Both MEH-PPV and BCHA-PPV are soluble in common organic solvents, thereby enabling relatively simple device fabrication by processing the active layer from solution.

LEDs with organic active layers and other organic diodes have the same classic structure as their inorganic predecessors. That is, the active layer, in the case of organic materials composed of semiconducting polymer, sandwiched between an inorganic anode, such as indium/tin oxide (ITO) and an inorganic cathode, typically of low-work function metal (such as Ca, Al, and the like). This structure is described in more detail in D. Braun and A. J. Heeger, Appl. Phys. Lett., 58, 1982 (1991).

In the field of organic polymer-based LEDs it has also been taught in the art to employ a conducting organic polymer, such as polyaniline (PANI), rather than an inorganic material as the hole-injecting contact in organic polymer-based LEDs. Using this approach, robust and mechanically flexible LEDs have been prepared. (G. Gustafsson, Y. Cao, G. M. Treacy, F. Klavetter, N. Colaneri, and A. J. Heeger, Nature, 357, 477 (1992))

Unfortunately, the new polymer light-emitting diodes still suffer two important drawbacks that impede large-scale applications. i) Readily detectable emission of light often requires a relatively high turn-on voltage. These relatively high voltages are often incompatible with digital electronics. ii) The external conversion efficiency, i.e. the amount of light emitted per unit of electricity, is low.

A recent publication has shown that by employing techniques used with other heterojunction devices which include an electron transport layer, device efficiency can be somewhat improved in polymer LEDs using BCHA-PPV (C. Zhang, S. Höger, K. Pakbaz, F. Wudl and A. J. Heeger, J. Electron. Mater., 22, 745 (1993)) and poly(phenylene vinylene), PPV.

Nevertheless, general and broad needs still exist for materials and methods of fabrication that result in improved diodes such as polymer light-emitting diodes with increased efficiency and decreased turn-on voltage.

SUMMARY OF THE INVENTION

An improved ohmic hole-injecting electrode or contact for diode structures has now been discovered. It has been found that multilayer composite materials give unexpectedly superior results in this application. The composite materials include a layer of a high work function inorganic material and a layer of conductive polyaniline ("PANI").

In preferred embodiments, the high work function layer is fabricated from a material and is of a thickness to permit substantial transparency and the PANI layer is of a thickness to permit transmission of a substantial fraction of light. These preferred materials can function as transparent electrodes in light-related diodes such as LEDs and photovoltaic cells.

The composite electrodes of this invention have unexpected advantages as compared to materials of the art. They have superior electrical properties as compared to the high work function inorganics alone, such as ITO, which have been commonly used in the past as transparent electrodes for polymer LEDs. They have a superior combination of electrical and optical properties as compared to electrodes made of PANI alone. PANI, in the emeraldine salt form such as prepared according to U.S. Pat. No. 5,232,631, and Applied Physics Letters, 60, 2711 (1992), has a higher work function than ITO, and therefore might be expected to provide better hole injection into the polymer active layer than ITO. The resistance of a very thin PANI film, which would present appropriate visual properties, is generally too high for most applications. In order to avoid significant voltage drop in the electrode, it is desirable to decrease the surface resistance of the anode to less than about 100 ohms/square. Although this can be achieved using a thicker layer (>2500 Å) of PANI, the deeply colored nature of PANI becomes a limitation. At these thicknesses, layers of PANI interfere with the optical performance of the LEDs giving transmittances of less than 70%, which would lead to more than a 30% loss in external quantum efficiency.

Surprisingly, the combination of an inorganic electrode with an ultrathin layer (typically<1000 Å) of PANI has a peak transmittance (~500 nm) around 90%, a work function similar to that of PANI alone and a surface resistance below that of ITO. The bilayer electrode offers special advantages for use in polymer LEDs in that the latter devices show an increase in efficiency of 40% or more and a lower turn-on voltage.

In one embodiment this invention provides an improved diode. This type of diode is one having in contact sequence an ohmic hole-injecting layer electrode, an active material and an electron-injecting layer electrode. The improvement involves employing a composite ohmic hole-injecting layer electrode made up of at least one layer of a high work function conductive inorganic material plus at least one layer of conductive polyaniline.

In another aspect this invention provides an increased efficiency diode. This increased efficiency is exhibited by LEDs which have higher quantum efficiency and which have lower turn on voltages, or both.

In preferred embodiments, the present bilayer composite electrodes comprise indium/tin/oxide (ITO) and conducting polyaniline, and combine high optical transmission, low surface resistance and a high work function. Use of the bilayer composite electrode significantly improves the performance of polymer LEDs in terms of a lower operating voltage and higher quantum efficiency.

In other aspects, the improved electrodes of this invention can be employed in arrays of light emitting diodes. These diode arrays involve a plurality of individual pixels which are light-emitting diodes, fabricated using semiconducting polymers as the active semiconducting layer and the electrodes of this invention as hole-injecting electrodes. These composite anodes may also be employed in combination with an active layer which is made up of a blend of a semiconducting conjugated polymer with one or more hole-transporting or electron-transporting polymers. They also may be used in diodes and diode arrays fabricated using semiconducting polymers as donor/acceptor heterojunctions utilizing layers of semiconducting conjugated polymers as the donor and acceptor layers.

DETAILED DESCRIPTION OF THE INVENTION

This Detailed Description has the following subjections:

Brief Description of the Drawings

Description of Preferred Embodiments

The Composite Ohmic Hole-Injecting Electrode

The Conductive Inorganic Layer

The Conductive Polyaniline Layer

The Active Material

The Electron-Injecting Electrode

The Substrate

Characteristics of LEDs

Fabrication Techniques

Examples

BRIEF DESCRIPTION OF THE DRAWINGS

Figure 1:
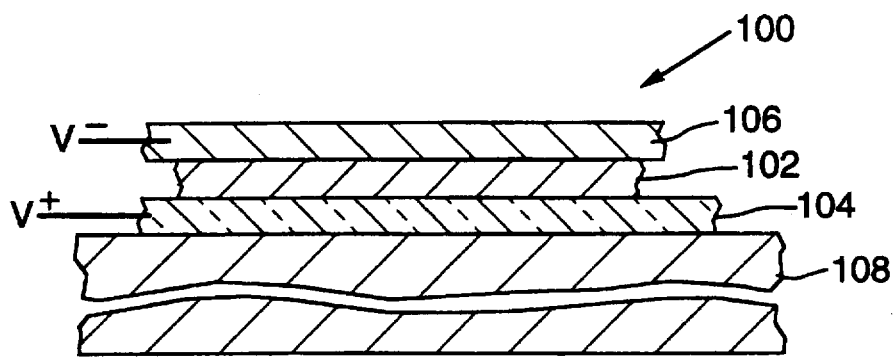

This invention will be further described with reference being made to the accompanying drawings in which:

FIG. 1 is a schematic cross-sectional view of a diode.

Figure 2:
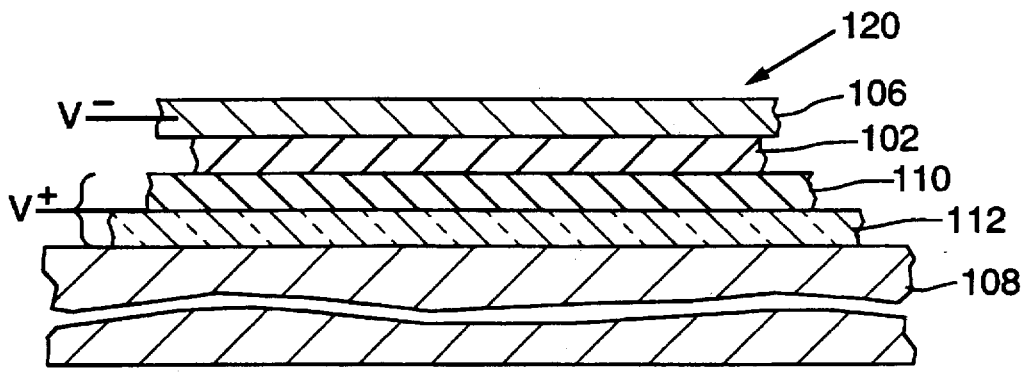

FIG. 2 is a schematic cross-sectional view of a diode of the present invention illustrating the composite bilayer electrode.

Figure 3:
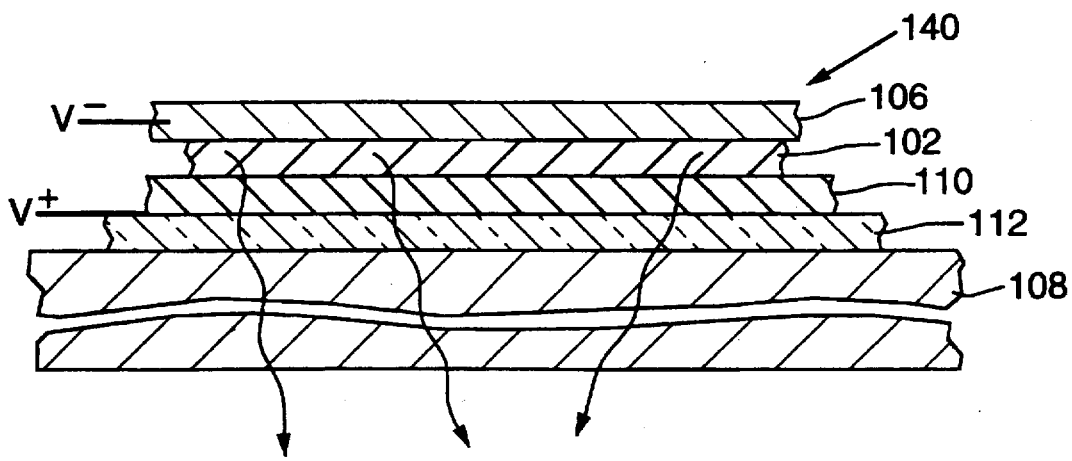

FIG. 3 is a schematic cross-sectional view of a diode of the present invention configured as a light-emitting diode illustrating the composite bilayer electrode as a transparent electrode.

Figure 4:
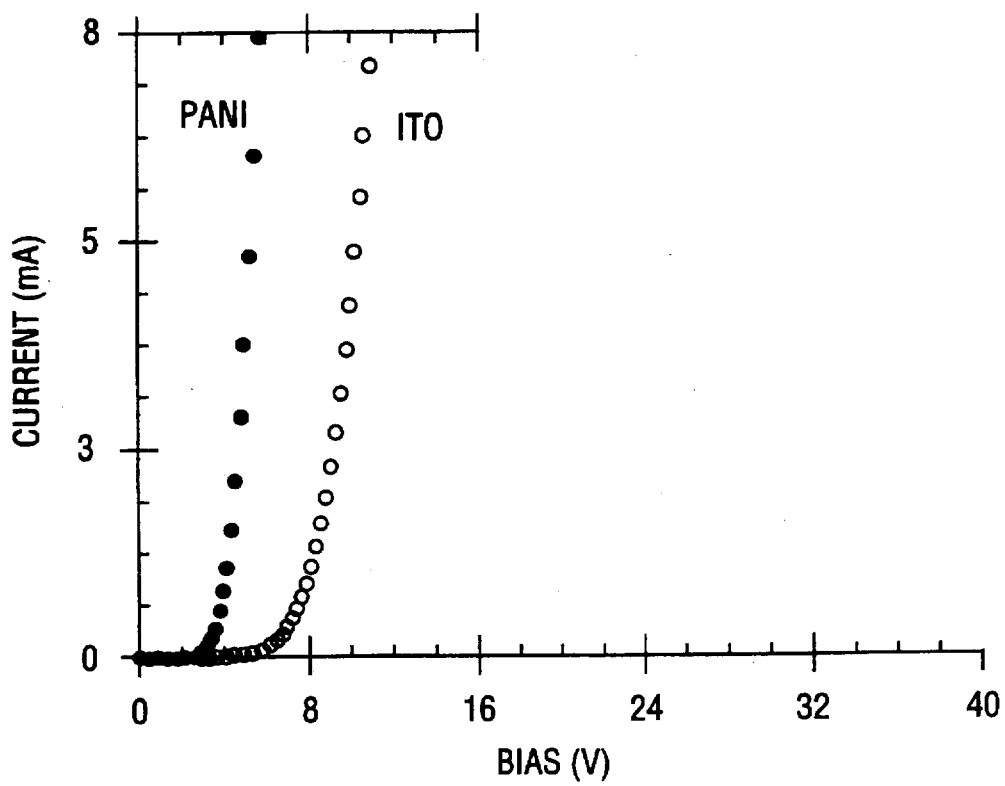

FIG. 4 is a graph which compares the current-voltage (I-V) curves obtained from LEDs made with organic polymer active layers and either anodes outside the present invention or anodes of the present invention.

Figure 5:
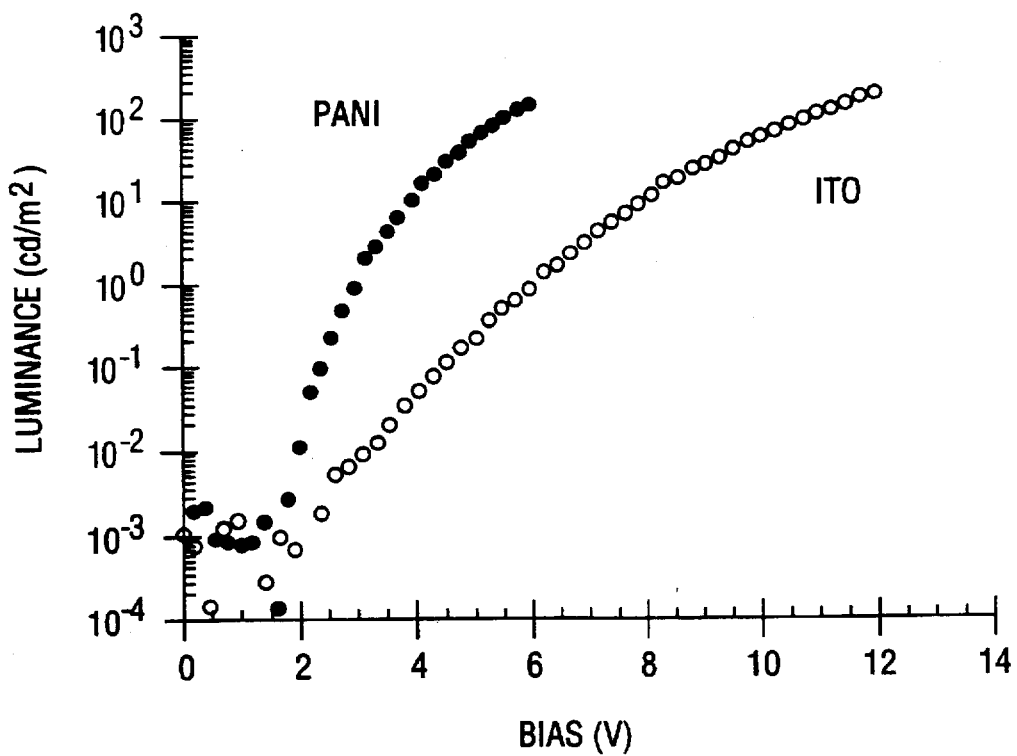

FIG. 5 is a graph which compares in semilog plots the light-voltage (L-V) curves obtained from LEDs made with organic polymer active layers and either anodes outside the present invention or anodes of the present invention.

Figure 6:
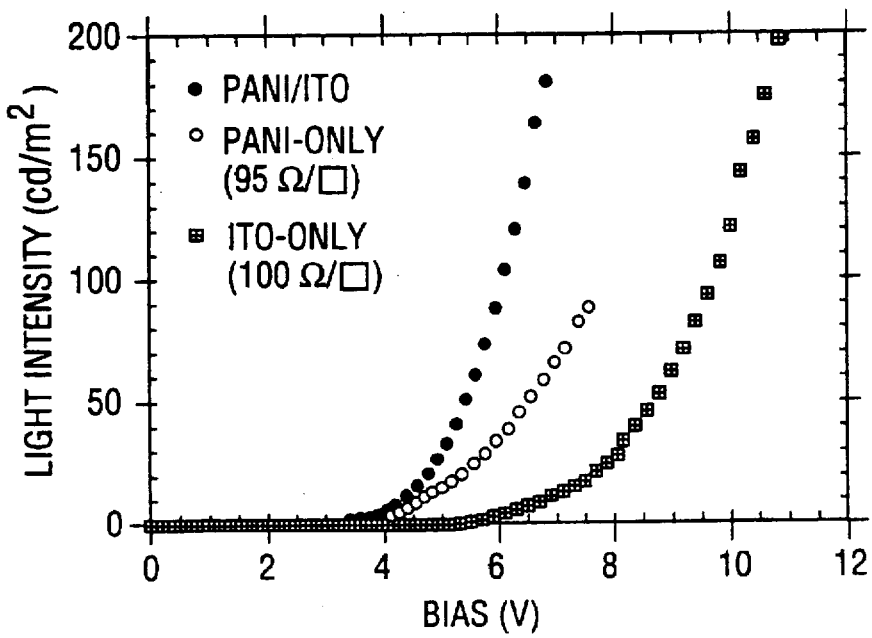

FIG. 6 is a graph which compares the light output vs bias voltage for LED devices constructed with anodes of ITO alone, PANI alone and with the PANI/ITO bilayer of this invention.

Figure 7:
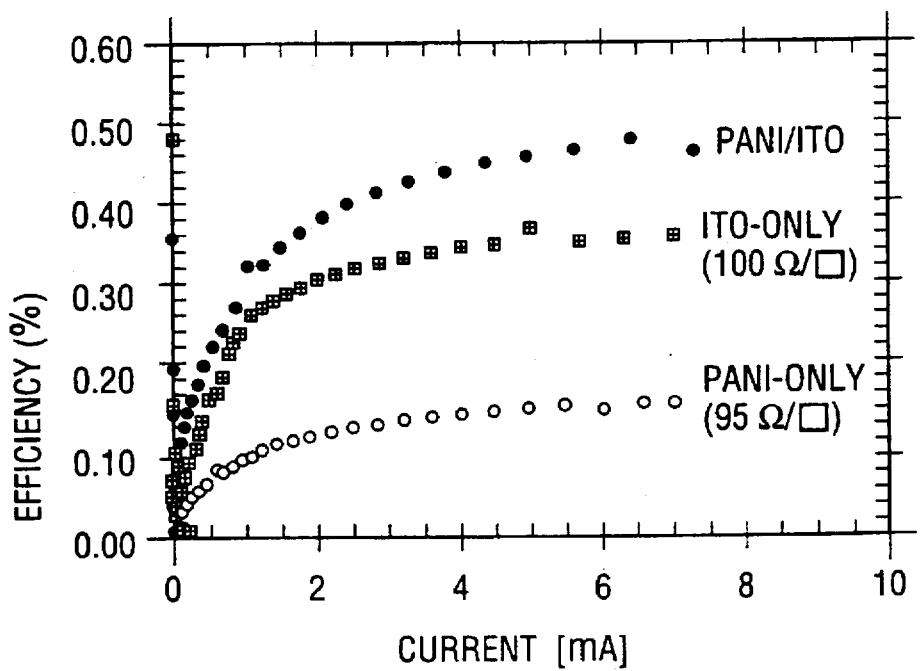

FIG. 7 is a graph which compares the quantum efficiency for LED devices with ITO alone, with PANI alone and with the PANI/ITO bilayer anodes.

Figure 8:
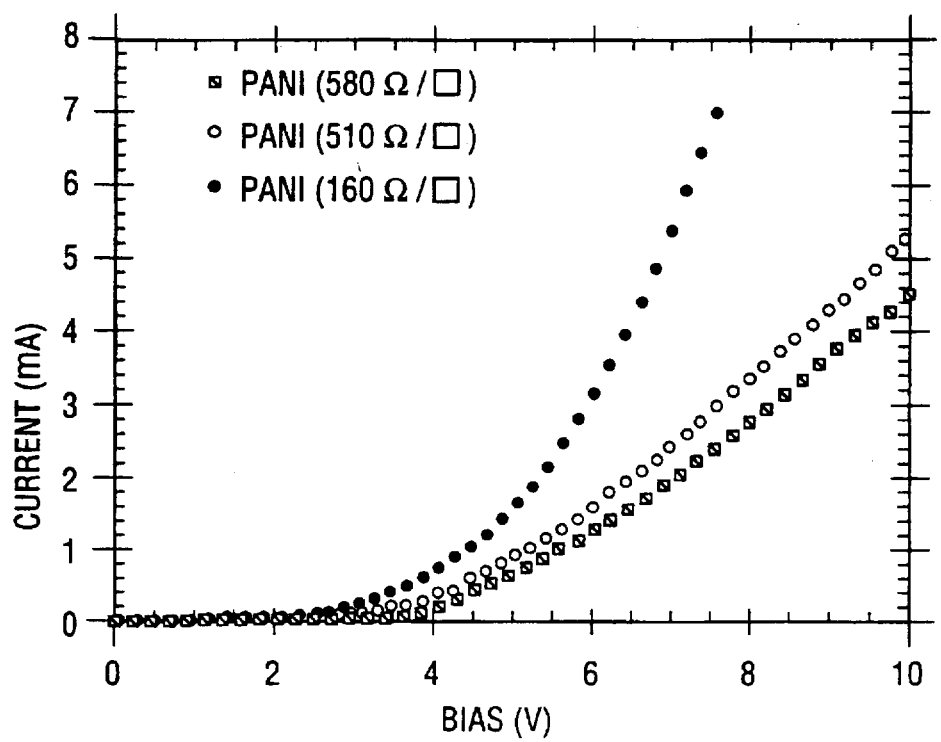

FIG. 8 is a series of graphs illustrating the I-V characteristics for PANI(no ITO)/MEH-PPV/Ca devices. The thickness of the PANI layer varies from ~2500 Å (160 ohms/square) to ~600 Å (580 ohms/square).

Figure 9:
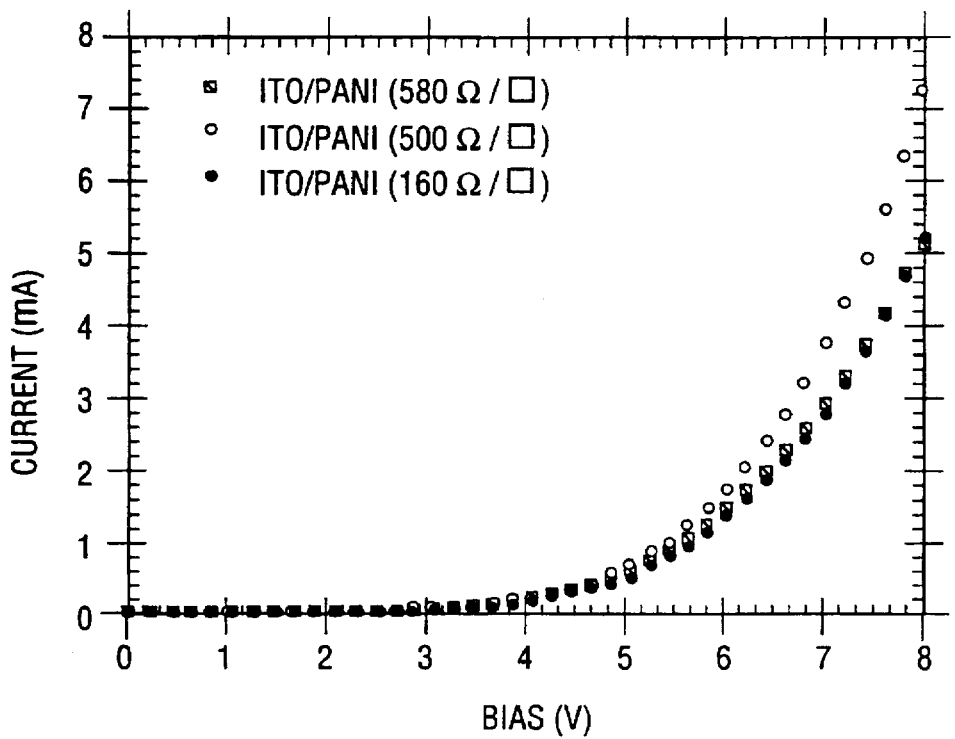

FIG. 9 is a series of graphs illustrating the I-V characteristics for ITO/PANI/MEH-PPV/Ca devices. The thickness of the PANI layer varies from ~2500 Å (160 ohms/square) to ~600 Å (580 ohms/square).

Figure 10:
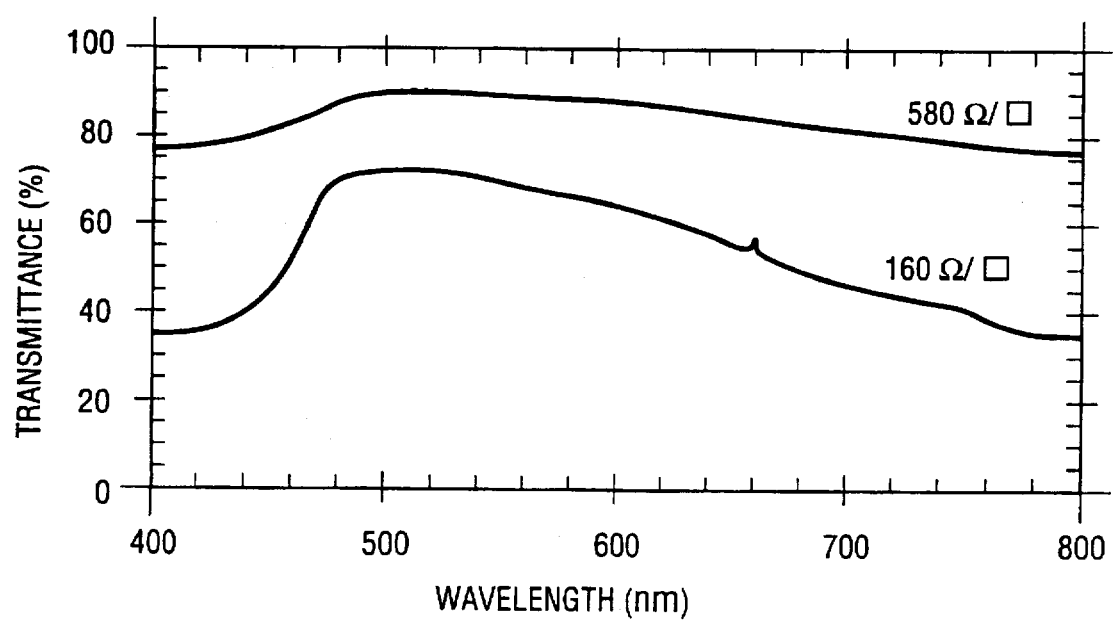

FIG. 10 is a graph of the transmittance of the thinnest PANI on ITO electrode of FIG. 9.

Figure 11:
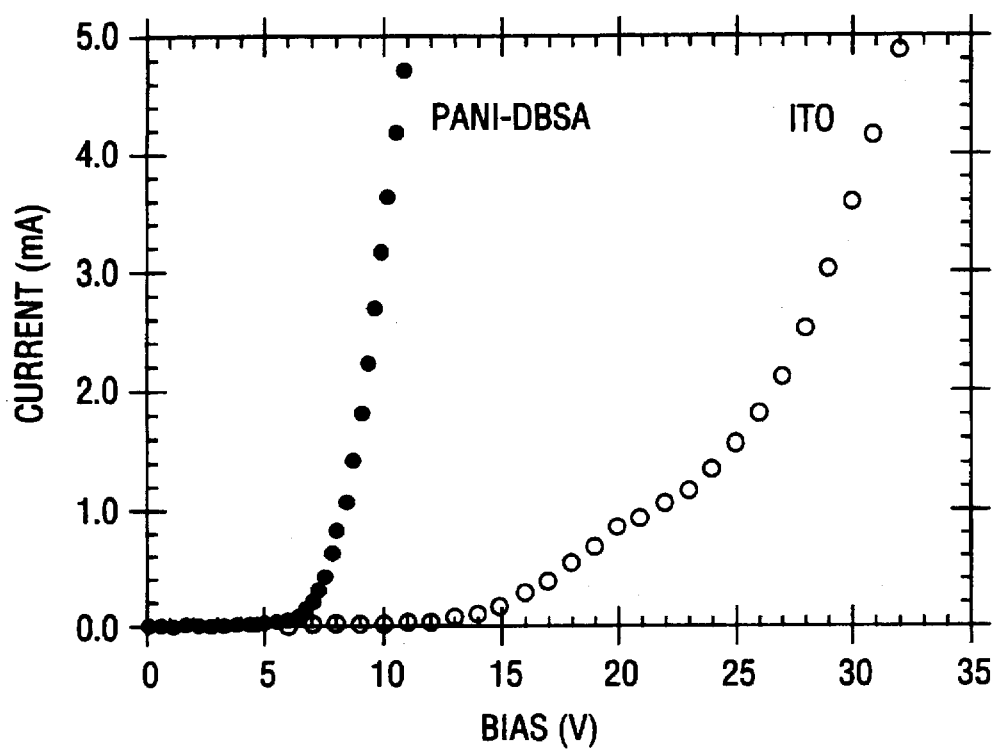

FIG. 11 is a graph which compares the current vs bias voltage for LED devices constructed with anodes of ITO alone and with another PANI/ITO bilayer of this invention, this time with the PANI being rendered conductive with a different ionic species, dodecylbenzenesulfonic acid ("DBSA").

Figure 12:
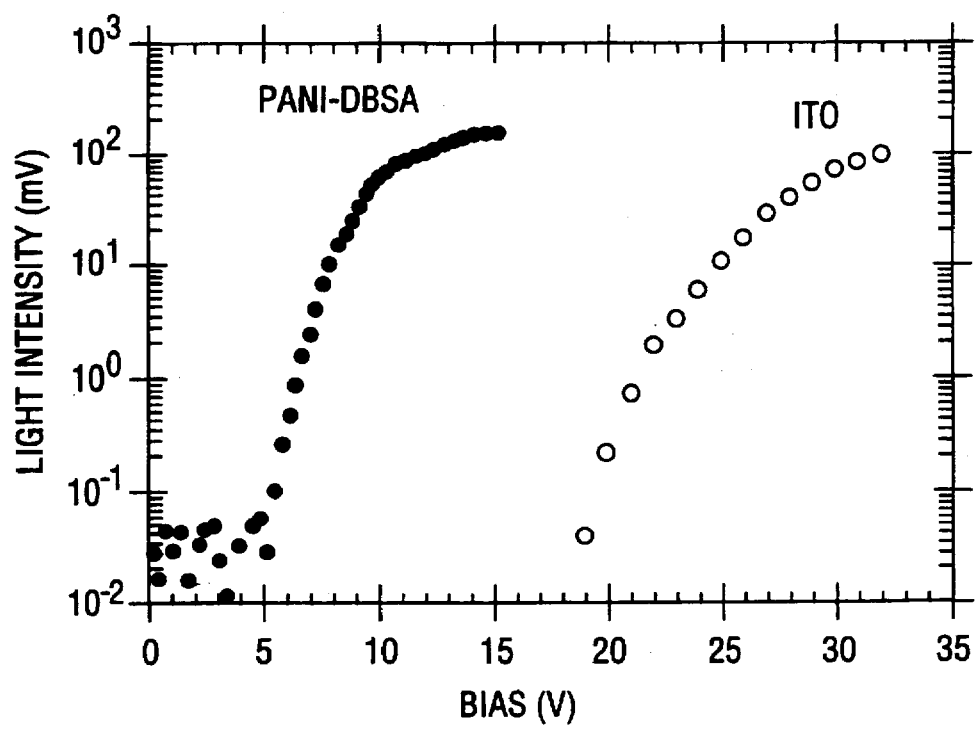

FIG. 12 is a graph which compares the emitted light intensity versus bias voltage for LED devices constructed with anodes of ITO alone and the PANI/ITO bilayer of FIG. 11.

DESCRIPTION OF THE PREFERRED EMBODIMENTS

As illustrated in FIG. 2, the diodes of this invention are characterized by having a composite hole-injecting electrode. In FIG. 2, diode 120 includes the active layer 102, the electron injecting electrode 106 and support 108 as in the prior art electrode 100 of FIG. 1. The hole-injecting electrode is made up of two layers—a thin polyaniline layer 110 adjacent to the active layer and an inorganic layer 112 adjacent to the polyaniline layer.

In several preferred embodiments the diode is a photoactive diode—either photovoltaic or light emitting. As illustrated in FIG. 3, in these embodiments it is necessary for the light to reach the active layer or to be observed when it is emitted. This can be accomplished in one configuration by making substrate 108 and anode layers 110 and 112 substantially transparent. As with conventional diodes, light emission or photovoltaic effects can be achieved by creating an "upside down" configuration in which the anode is away from the substrate and in which light is emitted or received through the composite anode but not necessarily through the substrate.

The Composite Ohmic Hole-Injecting Electrode

The composite ohmic hole-injecting layer or electrode is made up of layers of two separate distinguishable materials. The first layer is made up of an inorganic conductive material of high work function. This material is overlayed with a layer of conductive polyaniline. The polyaniline layer is the layer in contact with the active layer in the diode devices. While devices with a single layer of each of the two materials, as shown in FIGS. 2 and 3 are presently preferred, it is within the scope of this invention to employ anodes which have more than two layers. For example an anode could include a layer of inorganic conductive material sandwiched between two layers of polyaniline. Alternatively the anode could involve a series of repeating inorganic and polyaniline layers.

The Conductive Inorganic Layer

One layer in the composite anode is a conductive layer made of a high work function inorganic material, that is an inorganic material with a work function above about 4.5 eV. This layer can be a film of an electronegative metal such as gold or silver or alloys, with gold being the preferred member of that group. It can also be formed of a conductive metal-metal oxide mixture such as indium-tin oxide.

In the case of photoactive diodes such as LEDs and photovoltaic cells, it is desirable to have this layer be transparent. As used herein, the term "transparent" is defined to mean "capable of transmitting at least about 25%, and preferably at least about 50%, of the amount of light of a particular wave length of interest". Thus a material is considered "transparent" even if its ability to transmit light varies as a function of wave length but does meet the 25% or 50% criteria at a given wavelength of interest. As is known to those working in the field of thin films, one can achieve considerable degrees of transparency with metals if the layers are thin enough, for example in the case of silver and gold below about 300 angstroms, and especially from about 20 angstroms to about 250 angstroms with silver having a relatively colorless (uniform) transmittance and gold tending to favor the transmission of yellow to red wavelengths.

The conductive metal-metal oxide mixtures can be transparent as well at thicknesses up to as high as 2500 angstroms in some cases. Preferably, the thicknesses of metal-metal oxide (or dielectric) layers is from about 25 to about 1200 angstroms when transparency is desired.

This layer is conductive and should be low resistance: preferably less than 300 ohms/square and more preferably less than 100 ohms/square.

The Conductive Polyaniline Layer

The second layer of the composite anode comprises polyaniline. The exact form of polyaniline useful in this invention may vary widely and is not critical. Useful conductive polyanilines include the homopolymer, derivatives and blends with bulk polymers. Examples of PANI are those disclosed in U.S. Pat. No. 5,232,631, which is incorporated by reference herein. Preferred PANI has a bulk conductivity of at least $10^{-3}$ S/cm and a surface resistivity of less than 10,000 ohms/square. More preferred PANI has a bulk conductivity of at least $10^{-1}$ S/cm and a surface resistivity of less than 2,000 ohms/square. Most preferred PANI has a bulk conductivity of at least 1 S/cm and a surface resistivity of less than 1,000 ohms/square.

When the term "polyaniline" is used herein, it is used generically to include substituted and unsubstituted materials, unless the context is clear that only the specific nonsubstituted form is intended. It is also used in a manner to include any accompanying dopants, particularly acidic materials used to render the polyaniline conductive.

In general, polyanilines for use in the invention are polymers and copolymers of film and fiber-forming molecular weight derived from the polymerization of unsubstituted and substituted anilines of the Formula I:

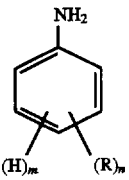

Formula I wherein
n is an integer from 0 to 4;
m is an integer from 1 to 5 with the proviso that the sum of n and m is equal to 5; and
R is independently selected so as to be the same or different at each occurrence and is selected from the group consisting of alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more sulfonic aid, carboxylic acid, halo, nitro, cyano or expoly moieties; or carboxylic acid, halogen, nitro, cyano, or sulfonic acid moieties; or any two R groups together may form an alkylene or alkenylene chain completing a 3, 4, 5, 6 or 7-membered aromatic or alicyclic ring, which ring may optionally include one or more divalent nitrogen, sulfur or oxygen atoms. Without intending to limit the scope of this invention, the size of the various R groups ranges from about 1 carbon (in the case of alkyl) through 2 or more carbons up through about 20 carbons with the total of n Rs being from about 1 to about 40 carbons.

Illustrative of the polyanilines useful in the practice of this invention are those of the Formula II to V:

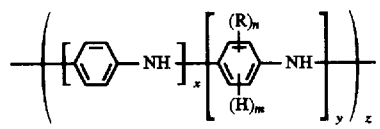

or

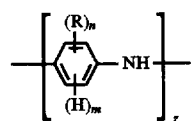

or

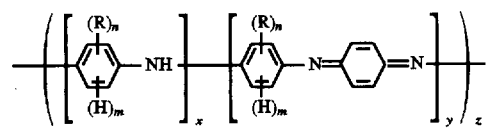

or

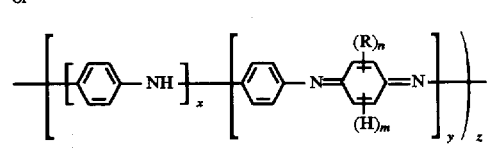

wherein:
n, m and R are as described above except that m is reduced by 1 as a hydrogen is replaced with a covalent bond in the polymerization and the sum of n plus m equals 4;

y is an integer equal to or greater than 0;

x is an integer equal to or greater than 1, with the proviso that the sum of x and y is greater than 1; and z is an integer equal to or greater than 1.

The following listing of substituted and unsubstituted anilines are illustrative of those which can be used to prepare polyanilines useful in the practice of this invention.

| | |
|---|---|
| Aniline | 2,5-Dimethylaniline |
| o-Toluidine | 2,3-Dimethylaniline |
| m-Toluidine | 2,5-Dibutylaniline |
| o-Ethylaniline | 2,5-Dimethoxyaniline |
| m-Ethylaniline | Tetrahydronaphthylamine |
| o-Ethoxyaniline | o-Cyanoaniline |
| m-Butylaniline | 2-Thiomethylaniline |
| m-Hexylaniline | 2,5-Dichloroaniline |
| m-Octylaniline | 3-(n-Butanesulfonic acid) |
| 4-Bromoaniline | aniline |
| 2-Bromoaniline | |
| 3-Bromoaniline | 2,4-Dimethoxyaniline |
| 3-Acetamidoaniline | 4-Mercaptoaniline |
| 4-Acetamidoaniline | 4-Methylthioaniline |
| 5-Chloro-2-methoxyaniline | 3-Phenoxyaniline |
| 5-Chloro-2-ethoxyaniline | 4-Phenoxyaniline |

Illustrative of useful R groups are alkyl, such as methyl, ethyl, octyl, nonyl, tert-butyl, neopentyl, isopropyl, sec-butyl, dodecyl and the like, alkenyl such as 1-propenyl, 1-butenyl, 1-pentenyl, 1-hexenyl, 1-heptenyl, 1-octenyl and the like; alkoxy such as propoxy, butoxy, methoxy, isopropoxy, pentoxy, nonoxy, ethoxy, octoxy, and the like, cycloalkenyl such as cyclohexenyl, cyclopentenyl and the like; alkanoyl such as butanoyl, pentanoyl, octanoyl, ethanoyl, propanoyl and the like; alkylsulfinyl, alkysulfonyl, alkylthio, arylsulfonyl, arylsulfinyl, and the like, such as butylthio, neopentylthio, methylsulfinyl, benzylsulfinyl, phenylsulfinyl, propylthio, octylthio, nonylsulfonyl, octylsulfonyl, methylthio, isopropylthio, phenylsulfonyl, methylsulfonyl, nonylthio, phenylthio, ethylthio, benzylthio, phenethylthio, naphthylthio and the like; alkoxycarbonyl such as methoxycarbonyl, ethoxycarbonyl, butoxycarbonyl and the like, cycloalkyl such as cyclohexyl, cyclopentyl, cyclooctyl, cycloheptyl and the like; alkoxyalkyl such as methoxymethyl, ethoxymethyl, butoxymethyl, propoxyethyl, pentoxybutyl and the like; aryloxyalkyl and aryloxyaryl such as phenoxyphenyl, phenoxymethylene and the like; and various substituted alkyl and aryl groups such as 1-hydroxybutyl, 1-aminobutyl, 1-hydroxylpropyl, 1-hydyroxypentyl, 1-hydroxyoctyl, 1-hydroxyethyl, 2-nitroethyl, trifluoromethyl, 3,4-epoxybutyl, cyanomethyl, 3-chloropropyl, 4-nitrophenyl, 3-cyanophenyl, and the like; sulfonic acid terminated alkyl and aryl groups and carboxylic acid terminated alkyl and aryl groups such as ethylsulfonic acid, propylsulfonic acid, butylsulfonic acid, phenylsulfonic acid, and the corresponding carboxylic acids.

Also illustrative of useful R groups are divalent moieties formed from any two R groups such as moieties of the formula:

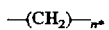

wherein n* is an integer from about 3 to about 7, as for example —(CH$_2$)—$_4$, —(CH$_2$)—$_3$ and —(CH$_2$)—$_5$, or such moieties which optionally include heteroatoms of oxygen and sulfur such as —CH$_2$SCH$_2$— and —CH$_2$—O—CH$_2$—. Exemplary of other useful R groups are divalent alkenylene chains including 1 to about 3 conjugated double bond unsaturation such as divalent 1,3-butadiene and like moieties.

Preferred for use in the practice of this invention are polyanilines of the above Formulas II to V in which:

n is an integer from 0 to about 2;

m is an integer from 2 to 4, with the proviso that the sum of n and m is equal to 4;

R is alkyl or alkoxy having from 1 to about 12 carbon atoms, cyano, halogen, or alkyl substituted with carboxylic acid or sulfonic acid substituents;

x is an integer equal to or greater than 1;

y is an integer equal to or greater than 0, with the proviso that the sum of x and y is greater than about 4, and z is an integer equal to or greater than about 5.

In more preferred embodiments of this invention, the polyaniline is derived from unsubstituted aniline, i.e., where n is 0 and m is 5 (monomer) or 4 (polymer). In general, the number of monomer repeat units is at least about 50.

The polyaniline can be conveniently used in the practice of this invention in any of its physical forms. Illustrative of useful forms are those described in Green, A. G., and Woodhead, A. E., "Aniline-black and Allied Compounds, Part 1," J. Chem. Soc., 101, pp. 1117 (1912) and Kobayashi, et al., "Electrochemical Reactions . . . of Polyaniline Film-Coated Electrodes," J. Electroanl. Chem., 177, pp. 281–91 (1984), which are hereby incorporated by reference. For unsubstituted polyaniline, useful forms include leucoemeraldine, protoemeraldine, emeraldine, nigraniline and tolu-protoemeraldine forms.

Useful polyanilines can be prepared through use of chemical synthetic procedures. For example, one form of polyaniline having at least about 160 repeat units can be prepared by treating aniline with ammonium persulfate $(NH_4)_2S_2O_8$ in excess 1M HCl. This powdered form of polyaniline is blue green in color. After methanol washing and air drying this material exhibits a conductivity of about 10 S-cm$^{-1}$. This conductive form of polyaniline can be treated with ammonium hydroxide in ethanol to form a nonconductive form of polyaniline which is purple in color and which has a conductivity of less than 10$^{-8}$ S-cm$^{-1}$. Other chemical procedures for preparation of various chemical forms of polyaniline are described in detail in Green et al. described above.

The polyaniline is rendered conductive by the presence of an oxidative or acidic species. Acidic species and particularly "functionalized protonic acids" are preferred in this role. A "functionalized protonic acid" is one in which the counter-ion has been functionalized preferably to be compatible with the other components of this layer. As used herein, a "protonic acid" is an acid that protonates the polyaniline to form a complex with said polyaniline, which complex has a conductivity equal to or greater than about 10$^{-3}$ S-cm$^{-1}$. Protonic acids are well known as dopants in the conductive polymer art as shown by the reference to J. C. Chiang and Alan G. MacDiarmid; and the reference to W. R. Salaneck et al., noted above, but are not necessarily compatible with nonconductive bulk polymers and the like which may be present in the polyaniline layer or solvents which may be present during formation of the polyaniline layer. The protonic acid is an acid that protonates the polyaniline to form a conductive complex with polyaniline In general, functionalized protonic acids for use in the invention are those of Formulas VI and VII:

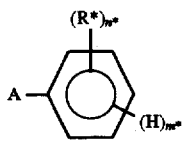

VI or

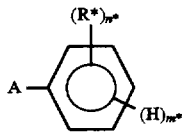

VII wherein:

A is sulfonic acid, selenic acid, phosphonic acid, boric acid or a carboxylic acid group; or hydrogen sulfate, hydrogen selenate, hydrogen phosphate;

n is an integer from 0 to 5;

m is an integer from 0 to 4 with the proviso that the sum of n and m is 5;

$R_1$ is alkyl, alkenyl, alkoxy, alkanoyl, alkylthio, alkylthioalkyl, having from 1 to about 20 carbon atoms; or alkylaryl, arylalkyl, alkylsulfinyl, alkoxyalkyl, alkylsulfonyl, alkoxycarbonyl, carboxylic acid, where the alkyl or alkoxy has from 0 to about 20 carbon atoms; or alkyl having from 3 to about 20 carbon atoms substituted with one or more sulfonic acid, carboxylic acid, halogen, nitro, cyano, diazo, or epoxy moieties; or a substituted or unsubstituted 3, 4, 5, 6 or 7 membered aromatic or alicyclic carbon ring, which ring may include one or more divalent heteroatoms of nitrogen, sulfur, sulfinyl, sulfonyl or oxygen such as thiophenyl, pyrolyl, furanyl, pyridinyl.

In addition to these monomeric acid forms, $R_1$ can be a polymeric backbone from which depend a plurality of acid functions "A." Examples of polymeric acids include sulfonated polystyrene, sulfonated polyethylene and the like. In these cases the polymer backbone can be selected either to enhance solubility in nonpolar substrates or be soluble in more highly polar substrates in which materials such as polymers, polyacrylic acid or poly(vinylsulfonate), or the like, can be used.

R* is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano, diazo or epoxy moieties; or any two R substituents taken together are an alkylene or alkenylene group completing a 3, 4, 5, 6 or 7 membered aromatic or alicyclic carbon ring or multiples thereof, which ring or rings may include one or more divalent heteroatoms of nitrogen, sulfur, sulfinyl, sulfonyl or oxygen. R* typically has from about 1 to about 20 carbons especially 3 to 20 and more especially from about 8 to 20 carbons. It will be appreciated that the depiction of the acids as A—$R_1$ is equivalent to their earlier depiction as $H^+(M^-—R_p)$ and that the acids fall within the general structure of A—$R_1$.

Materials of the above Formulas VI and VII are preferred in which:

A is sulfonic acid, phosphonic acid or carboxylic acid;

n* is an integer from 1 to 3;

m* is an integer from 0 to 4 with the proviso that the sum of n and m is 5;

$R_1$ is alkyl, alkenyl, alkoxy, having from 6 to about 14 carbon atoms; or arylalkyl, where the alkyl or alkyl portion or alkoxy has from 4 to about 14 carbon atoms; or alkyl having from 6 to about 14 carbon atoms substituted with one or more, carboxylic acid, halogen, diazo, or epoxy moieties;

R* is the same or different at each occurrence and is alkyl, alkoxy, alkylsulfonyl, having from 4 to 14 carbon atoms, or alkyl substituted with one or more halogen moieties again with from 4 to 14 carbons in the alkyl.

Among the particularly preferred embodiments, most preferred for use in the practice of this invention are functionalized protonic acid solutes of the above Formulas VI and VII in which:

A is sulfonic acid;

n* is the integer 1 or 2;

m* is the integer 3 or 4 with the proviso that the sum of n and m is 5;

$R_1$ is alkyl or alkoxy, having from 6 to about 14 carbon atoms; or alkyl having from 6 to about 14 carbon atoms substituted with one or more halogen moieties;

R* is alkyl or alkoxy, having from 4 to 14, especially 12 carbon atoms, or alkyl substituted with one or more halogen, moieties.

In the most preferred embodiments of this invention, the functionalized protonic acid solute is dodecylbenzene sulfonic acid.

The amount of functionalized protonic acid employed can vary depending on the degree of conductivity required. In general, sufficient functionalized protonic acid is added to the polyaniline-containing admixture to form a conducting material. Usually the amount of functionalized protonic acid employed is at least sufficient to give a conductive polymer (either in solution or in solid form) having a conductivity of at least about $10^{-9}$ S-cm$^{-1}$.

The polyaniline layer often will include a third component. This can be an organic solvent, or it can be bulk oligomeric or polymeric or prepolymeric materials which can be put into a fluid (liquid or semisolid) form during processing. Preferred of these substrates are those common organic solvents, or meltable, malleable oligomers or polymers.

Illustrative of useful common solvents are the following materials: substituted or unsubstituted aromatic hydrocarbons such as benzene, toluene, p-xylene, m-xylene, naphthalene, ethylbenzene, styrene, aniline and the like; higher alkanes such as pentane, hexane, heptane, octane, nonane, decane and the like; cyclic alkanes such as decahydronaphthalene; halogenated alkanes such as chloroform, bromoform, dichloromethane and the like; halogenated aromatic hydrocarbons such as chlorobenzene, o-dichlorobenzene, m-dichlorobenzene, p-dichlorobenzene and the like; higher alcohols such as 2-butanol, 1-butanol, hexanol, pentanol, decanol, 2-methyl-1-propanol and the like; higher ketones such as hexanone, butanone, pentanone and the like; heterocyclics such as morpholine; perfluorinated hydrocarbons such as perfluorodecaline, perfluorobenzene and the like. Mixtures of such nonpolar organic solvents can also be used as for example mixtures of xylene and chlorobenzene.

Illustrative of useful oligomeric materials are higher alkanes such as hexatriacontane, dotriadecane, octadodecane; branched higher alkanes and waxes, and perfluorinated higher alkanes and waxes. Illustrative of useful polymeric substrates are liquefiable polyethylenes, isotactic polypropylene, polystyrene, poly(vinylalcohol), poly(ethylvinylacetate), polybutadienes, polyisoprenes, ethylenevinylenecopolymers, ethylene-propylene copolymers, poly(ethyleneterephthalate), poly(butyleneterephthalate) and nylons such as nylon 12, nylon 8, nylon 6, nylon 6.6 and the like.

The relative proportions of the polyaniline, dopant and optional bulk polymer or solvent can vary. One may use polkyaniline with only that amount of dopant called for to provide conductivity, i.e. about 1 or more equivalents of dopant per equivalent of aniline. For each part of polyaniline there can be from 0 to as much as 200 parts of bulk polymer or solvent.

The thickness of the PANI layer will be chosen with the properties of the diode in mind. In those situations where the composite anode is to be transparent, it is preferable to have the layer of PANI as thin as possible. Typical thicknesses range from about 25 angstroms to about 2000 angstroms. When transparency is desired, thicknesses of from about 25 to about 1000 angstroms are preferred and especially from about 100 to 900 angstroms.

The Active Material

A wide variety of semiconducting and luminescent conjugated polymers can be used for the active material layer, and are well known in the art depending upon the properties desired of the diodes. In the case of LEDs active materials include but are not limited to poly(phenylenevinylene), PPV, and alkoxy derivatives of PPV, such as for example, poly(2-methoxy,5-(2'-ethyl-hexyloxy)-p-phenylenevinylene) or "MEH-PPV" (U.S. Pat. No. 5,189,136). (The structure of this material is given below.) BCHA-PPV is also an attractive active material. (See U.S. patent application Ser. No. 07/626463 and below for structure.) PPPV is also suitable. (C. Zhang et al, in Synth. Met., 62, 35, (1994) and references therein.) Other typical materials include the soluble derivatives of polythiophene, for example the poly(3-alkylthiophenes) or "P3AT"s where the alkyls are from about 6 to about 16 carbons atoms in length such as poly(2,5-dimethoxy-p-phenylene vinylene)-"PDMPV", and poly(2,5-thienylenevinylene). Further information on suitable materials may be found in C. Zhang et al, J. Appl. Phys., 73, 5177, (1993).

Structures of the preferred MEH-PPV and BCHA-PPV materials are as follows:

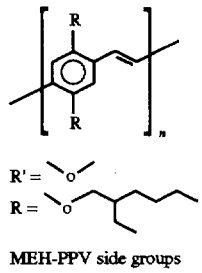

MEH-PPV side groups

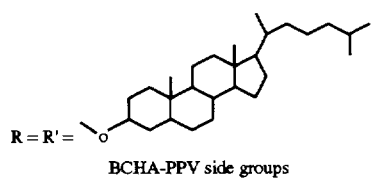

BCHA-PPV side groups

Blends of these and other semiconducting conjugated polymers which exhibit photoluminescence can be used as can blends of such semiconducting and luminescent conjugated polymers in hole-transporting or electron-transporting polymers (C. Zhang et al, in Synth. Met., 62, 35, (1994)) and heterojunctions utilizing layers of semiconducting and luminescent conjugated polymers as donors and acceptors. These structures are described in N. S. Sariciftci et al, Appl. Phys. Lett., 62, 585, 1993. Typical film thicknesses of the semiconductive active polymers range from a few hundred Ångstrom units to a few thousand Ångstrom units (1 Ångstrom unit=$10^{-8}$ cm). Although the active film thicknesses are not critical, device performance can typically be improved by using thinner films.

In some embodiments, the conjugated polymer is present in the active layer in admixture with a carrier polymer. The criteria for the selection of the carrier polymer are as follows. The material should allow for the formation of mechanically coherent films, at low concentrations, and remain stable in solvents that are capable of dispersing or dissolving the conjugated polymers for forming the final film. Low concentrations of carrier polymer are preferred in order to minimize processing difficulties, i.e., excessively high viscosity or the formation of gross inhomogeneities; however the concentration of the carrier should be high enough to allow for formation of coherent structures. Preferred carrier polymers are high molecular weight (M.W.>100,000) flexible chain polymers, such as polyethylene, isotactic polypropylene, polyethylene oxide, polystyrene, and the like. Under appropriate conditions, which can be readily determined by those skilled in the art, these macromolecular materials enable the formation of coherent structures from a wide variety of liquids, including water, acids, and numerous polar and nonpolar organic solvents. Films or sheets manufactured using these carrier polymers have sufficient mechanical strength at polymer concentrations as low as 1%, even as low as 0.1%, by volume to enable the coating and subsequent processing as desired.

Examples of such coherent structures are those comprised of poly(vinyl alcohol), poly(ethylene oxide), poly-para(phenylene terephthalate), poly(parabenzamide), etc., and suitable liquids. On the other hand, if the blending of the final polymer cannot proceed in a polar environment, nonpolar carrier structures are selected, such as those containing polyethylene, polypropylene, poly(butadiene), and the like.

The Electron-Injecting Electrode

The diodes also include a low work function electron-injecting contact. This contact is typically a low work function material as most commonly a low work function metal. Useful metals for practice in the present invention are well known in the art and include, for example pure metals such as Ca, Al, and In, as well as low work function metal alloys such as Ag:Mg, and Al:Li. Any low work function (low ionization potential) conducting material can be used in place of a conventional metal as the electron-injecting contact; for example, an electropositive (n-type) conducting polymer such as polyquinoline, or the like can be used.

The thickness of the electron-injecting electrode film is not critical so long as it is thick enough to achieve the desired surface resistance.

The Substrates

In most embodiments, the diodes are prepared on a substrate. Typically the substrate should be nonconducting. In some embodiments, such as LEDs or photovoltaic cells in which light passes through it, it is transparent. It can be a rigid material such as a rigid plastic including rigid acrylates, carbonates, and the like, rigid inorganic oxides such as glass, quartz, sapphire, and the like. It can also be a flexible transparent organic polymer such as polyester—for example polyethyleneterephthalate, flexible polycarbonate, poly (methyl methacrylate), poly(styrene) and the like.

The thickness of this substrate is not critical.

Characteristics of LEDs

In a preferred embodiment, the composite anodes of the invention are employed in LEDs. In this application they offer significant advantages. For one, the turn on voltage of the LED's are reduced. An LED which might exhibit a turn on voltage of say 8 volts with an ITO anode will turn on at 4–6 volts with the composite electrodes. One which might have a 15 volts will turn on at 6–8 volts with the present anodes. Expressed in terms of percentages, the anodes of this invention typically allow a turn on at from 50 to 70% the normal voltage. As shown in the Examples, results have been achieved wherein the composite anodes can reduce the turn on voltage by as much as a factor of 4, that is a reduction to 25% of conventional. With optimization, these values will doubtless improve.

Similarly, the efficiency of the LEDs is dramatically improved. As pointed out in the Examples, improvements of as much as 250% have been achieved. Typically an improvement in efficiency of at least about 50% such that the wattage needed to generate a given quantity of light is reduced to about 0.6 times conventional and often to about 0.4 times conventional is possible.

Fabrication Techniques

The various elements of the devices of the present invention may be fabricated by any of the techniques well known in the art, such as solution casting, sputtering, evaporation, precursor polymer processing, melt-processing, and the like, or any combination thereof.

In the most common approach, the diodes are built up by sequential deposit of layers upon a substrate. In a representative preparation, the inorganic portion of the composite electrode is laid down first. This layer is commonly deposited by vacuum sputtering (RF or Magnetron) electron beam evaporation, thermal vapor deposition, chemical deposition and the like.

Next, the polyaniline layer is laid down. The polyaniline layer is usually most conveniently deposited as a layer from solution. In these solutions, preferred solvents are common organic solvents such as toluene, xylenes, styrene, aniline, decahydronaphthalene, chloroform, dichloromethane, chlorobenzenes, morpholine, and particularly preferred solvents are toluene, xylenes, decahydronaphthalene, and chloroform.

Next, the active layer of conjugated polymer is deposited. The conjugated polymer can be deposited or cast directly from solution. The solvent employed is one which will dissolve the polymer and not interfere with its subsequent deposition.

Typically, organic solvents are used. These can include halohydrocarbons such as methylene chloride, chloroform, and carbon tetrachloride, aromatic hydrocarbons such as xylene, benzene, toluene, other hydrocarbons such as decaline, and the like. Mixed solvents can be used, as well. Polar solvents such as water, acetone, acids and the like may be suitable. These are merely a representative exemplification and the solvent can be selected broadly from materials meeting the criteria set forth above.

When depositing the conjugated polymer on a substrate, the solution can be relatively dilute, such as from 0.1 to 20% w in concentration, especially 0.2 to 5% w. Film thicknesses of 50–400 and 100–200 nm are used.

Finally the low work function electron injecting contact is added. This contact is typically a low work function metal electrode which is typically vacuum evaporated onto the top surface of the active polymer layer.

These steps can be altered and even reversed if an "upside down" diode is desired. These fabrication techniques are described in more detail in the art such as U.S. patent application Ser. No. 07/662,290.

It will also be appreciated that the structures just described and their fabrication can be altered to include other layers for physical strength and protection, to alter the color of the light emission or sensitivity of the diodes or the like.

The following general methods and specific examples are presented merely to illustrate the invention and are not to be construed as limitations thereon.

EXAMPLES

Example 1

Three-layer LED devices were prepared. Each consisted of a conducting anode layer, a polymer active layer, and a metal (Ca and Cu) cathode layer. In the devices of the invention, the anode was a composite of a layer of indium tin oxide on a substrate overlaid with PANI. The metallic emeraldine salt form of PANI was prepared by doping and complexation with functionalized sulfonic acids (e.g. camphor sulfonic acid, CSA), yielding a conducting PANI-complex soluble in common organic solvents (Y. Cao, P. Smith and A. J. Heeger, Synth. Met. 55–57, 3514 (1993)). Thin PANI-CSA films were spin-cast from solution in meta-cresol (3.5% by weight) at 8000 rpm and subsequently dried in air at 50° C. for 12 hours. The typical thickness of the PANI layers was 600–800 Å. Other, thicker PANI layers were also used to compare device performance.

The active luminescent layers were fabricated by spin-casting MEH-PPV from a xylene solution, 8 mg/ml concentration, at 1000 rpm. Details on the synthesis of MEH-PPV can be found in literature (F. Wudl, P. M. Allemand, G. Srdanov, Z. Ni, and D. McBranch, in *Materials for Nonlinear Optics: Chemical Perspectives*, Ed. S. R. Marder, J. E. Sohn and G. D. Stucky (American Chemical Society, Washington, DC, 1991) p. 683–686). Typical MEH-PPV films were 1200–1500 Å thick.

Vapor deposition of metal cathodes (Ca and Cu) was carried out at pressures around $5 \times 10^{-7}$ Torr and evaporation rates of ~5 Å/s. Diode areas were 12 mm$^2$. All fabrication and testing steps were performed in inert atmosphere.

Absolute values for the external quantum efficiency were measured with a calibrated integrating sphere. Luminance measurements were made using a calibrated spot photometer with a field of view of 0.8 mm.

FIG. 4 shows the current-voltage (I–V) curves obtained from MEH-PPV LEDs using the same ITO layer alone (as a reference outside the present invention) and using ITO/PANI as anode and using Ca as the cathode material. The operating voltage of the MEH-PPV LED with an ITO/PANI anode is significantly lower (typically ~30–50% lower) than with the conventional ITO anode. In addition, the external quantum efficiency of MEH-PPV LEDs with ITO/PANI anodes are about 40–50% higher than that of the ITO/MEH-PPV/Ca devices.

The light vs voltage (L–V) curves always followed the I–V curves. FIG. 5 shows a semi-log plot of the L–V curves for the two devices. Both began to emit light below 2V; however, devices with holes injected through the ITO/PANI electrode into the polymer were much more efficient than devices fabricated with the ITO electrode alone.

For further comparison purposes, the diode of the invention was duplicated with an additional change. Instead of the composite anode, an anode having only the PANI layer was prepared and tested as just described.

FIG. 6 compares the light output vs bias voltage for devices with anodes of ITO only, PANI-only and with the PANI/ITO bilayer. The turn-on and operating voltages are significantly lower with the PANI-ITO bilayer composite electrode.

FIG. 7 compares the quantum efficiency for devices with ITO only, PANI-only and with the PANI/ITO bilayer. The quantum efficiency is significantly higher with the PANI-ITO bilayer composite electrode.

This example demonstrates the advantages of the PANI/ITO bilayer composite electrode in polymer light emitting diodes.

Example 2

In order to determine the role of the ITO layer in the ITO/PANI composite electrode, LEDs were fabricated with different thickness PANI layers as anodes. (These diodes with only a PANI anode were outside the present invention.) It was found that the surface resistance of the PANI electrodes needed to be reduced below 160 ohms/square to reproduce the IV characteristics of the ITO/PANI electrode. Data are shown in FIG. 8 for a PANI(no ITO)/MEH/Ca device. Devices with a PANI layer with surface resistance of ~500 ohms/square draw relatively low current during operation, implying that the LED current is limited by the surface resistance of the PANI-only electrode. The resistance of the MEH-PPV layer is R=V/I~1 KW, comparable to the PANI surface resistance for the 12 mm² devices.

Using ITO/PANI electrodes, however, the I–V curves are independent of the PANI layer thickness, FIG. 9, indicating that the series resistance of the PANI/ITO bilayer is not limiting. FIG. 10 demonstrates the excellent transparency of the composite PANI/ITO bilayer electrode; even in the blue portion of the spectrum (where the PANI absorption is maximum), the transmittance is about 80%.

Example 3

Example 1 was repeated but BCHA-PPV was used instead of MEH-PPV. The operating voltage of the BCHA-PPV with an ITO/PANI anode was significantly lower (50% lower) than with an ITO anode. The external quantum efficiency of BCHA-PPV LEDs with ITO/PANI anodes was 30% higher than that of the ITO/BCHA-PPV/Ca devices.

Example 4

Example 1 was repeated but polyaniline/dodecylbenzene sulfonic acid (DBSA), spun from toluene, was used instead of PANI/CSA [ref. Y. Cao, P. Smith and A. J. Heeger, Synth. Met. 55–57, 3514 (1993)). The operating voltage of the MEH-PPV diode with an ITO/PANI-DBSA anode was significantly lower (30–40% lower) than with an ITO anode. The external quantum efficiency of MEH-PPV LEDs with ITO/PANI-DBSA anodes were 40% higher than that of the ITO/MEH-PPV/Ca devices.

Example 5

A composite ITO/PANI-DBSA bilayer electrode was used to improve the performance of a polymer LED which emits blue light. The device structure used in this example was as follows:

ITO/PANI-DBSA (500 Å)/$P_{blue}$(1000 Å)/$P_{PBD}$(150 Å)/Ca (1500 Å) where $P_{blue}$ is a blue-emitting polymer containing phenylene units as the active chromophore. This blue-emitting polymer was spin-cast from chloroform. A thin electron injection and hole blocking layer ($P_{PBD}$) comprised of units of 2-(4-biphenyl)-5-(4-tert-butylphenyl)-1,3,3-oxidiazole, PBD, was inserted between the active luminescent layer and the Ca electron-injecting electrode. Compared with the device using ITO alone (i.e., no PANI-DBSA), the device with the composite bilayer electrode of the present invention exhibited a turn-on voltage which was lowered by a factor of four, from 20V to less than 5V. Simultaneously, the external quantum efficiency of the device using the composite bilayer was improved from 0.02% to 0.05%. These results are depicted in FIGS. 11 and 12 respectively.

What is claimed is:

1. In a diode comprising an ohmic hole-injecting layer electrode in contact with a first side of a layer of an electrically active material and an electron-injecting layer electrode in contact with a second side of said layer of an electrically active material, the improvement comprising employing as said ohmic hole-injecting layer electrode a composite ohmic hole-injecting layer electrode comprising at least one layer of a high work function conductive inorganic material plus at least one layer of conductive polyaniline.

2. The diode of claim 1 wherein one of said at least one layers of conductive polyaniline in said composite ohmic hole-injecting layer is in contact with said second side of said layer of an electrically active material.

3. The diode of claim 2 wherein the composite ohmic hole-injecting electrode consists essentially of a layer of a high work function conductive inorganic material plus a layer of conductive polyaniline.

4. The diode of claim 2 wherein the high work function conductive inorganic material is a high work function 1 metal.

5. The diode of claim 2 wherein the high work function conductive inorganic material is a high work function metal/metal oxide.

6. The diode of claim 5 wherein the high work function metal/metal oxide is indium/tin oxide.

7. The diode of claim 2 wherein the polyaniline is in the emeraldine form.

8. The diode of claim 6 wherein the polyaniline is in the emeraldine form.

9. The diode of claim 8 wherein the polyaniline is selected from PANI-CSA and PANI-DBSA.

10. The diode of claim 2 wherein the diode is a light-reactive photovoltaic diode and wherein the thicknesses of the layers in the composite ohmic hole-injecting layer electrode are selected to permit the light employed by the photovoltaic diode to pass through the composite ohmic hole-injecting layer electrode.

11. The diode of claim 10 wherein the layer of polyaniline is from 25 to 1000 Å in thickness.

12. The diode of claim 2 wherein the diode is a light-emitting diode and wherein the thicknesses of the layers in the composite ohmic hole-injecting layer electrode are selected to permit the light emitted by the light-emitting diode to pass through the composite ohmic hole-injecting layer electrode.

13. The diode of claim 12 wherein the layer of polyaniline is from 25 to 1000 Å in thickness.

14. The diode of claim 13 wherein the composite ohmic hole-injecting electrode consists essentially of a layer of a high work function conductive inorganic material plus a layer of conductive polyaniline.

15. The diode of claim 13 wherein the high work function conductive inorganic material is a high work function metal.

16. The diode of claim 13 wherein the high work function conductive inorganic material is a high work function metal/metal oxide.

17. The diode of claim 16 wherein the high work function metal/metal oxide is indium/tin oxide.

18. The diode of claim 13 wherein the polyaniline is in the emeraldine form.

19. The diode of claim 17 wherein the polyaniline is in the emeraldine form.

20. The diode of claim 19 wherein the polyaniline is selected from PANI-CSA and PANI-DBSA.

21. The diode of claim 12 wherein the electrically active material comprises an electroluminescent conjugated semiconducting organic polymer.

22. The diode of claim 21 wherein the electroluminescent conjugated semiconducting organic polymer is selected from the group consisting of poly(phenylenevinylene) and alkoxy derivatives thereof, including poly(2-methoxy,5-(2'-ethyl-hexyloxy)-p-phenylenevinylene), poly(2,5-bis (cholestanoxy)-1,4-phenylene vinylene), PPPV soluble derivatives of polythiophene including poly(3-alkylthiophene) wherein the alkyl is from about 6 to about 16 carbons atoms in length and poly(2,5-thienylenevinylene).

23. The diode of claim 22 wherein the electroluminescent conjugated semiconducting organic polymer is selected from the group consisting of poly(2-methoxy,5-(2'-ethyl-hexyloxy)-p-phenylenevinylene), poly(2,5-bis (cholestanoxy)-1,4-phenylene vinylene), and poly(2,5-dimethoxy-p-phenylene vinylene).

24. The diode of claim 17 wherein the electrically active material comprises a electroluminescent conjugated semiconducting organic polymer.

25. The diode of claim 24 wherein the electroluminescent conjugated semiconducting organic polymer is selected from the group consisting of poly(2-methoxy,5-(2'-ethyl-hexyloxy)-p-phenylenevinylene), poly(2,5-bis (cholestanoxy)-1,4-phenylene vinylene), and poly(2,5-dimethoxy-p-phenylene vinylene).

26. The diode of claim 25 wherein the polyaniline is in the emeraldine form.

27. The diode of claim 26 wherein the polyaniline is selected from PANI-CSA and PANI-DBSA.

28. The diode of claim 21 wherein the active material additionally comprises a hole-transporting polymer as a blend with the electroluminescent conjugated semiconducting polymer.

29. The diode of claim 21 wherein the active material additionally comprises an electron-transporting polymer as a blend with the electroluminescent conjugated semiconducting polymer.

30. A process for producing light comprising
  (a) applying a given voltage across the composite ohmic hole-injecting layer electrode and the electron-injecting layer electrode of the light-emitting diode of claim 12, said given voltage being not greater than 0.6 times the voltage necessary to produce light from a light-emitting diode having a noncomposite high work function inorganic ohmic hole-injecting layer electrode but being otherwise identical to the light emitting diode of claim 12 and
  (b) using said light.

31. A process for producing a defined quantity of light comprising
  (a) applying a given wattage across the composite ohmic hole-injecting layer electrode and the electron-injecting layer electrode of the light emitting diode of claim 12, said given wattage being not greater than 0.6 times the wattage necessary to produce said defined quantity of light from a light-emitting diode having a noncomposite high work function inorganic ohmic hole-injecting layer electrode but being otherwise identical to the light-emitting diode of claim 12 and
  (b) using said defined quantity of light.

32. A process for producing a defined quantity of light comprising
  (a) applying a given wattage at a given voltage across the composite ohmic hole-injecting layer electrode and the electron-injecting layer electrode of the light emitting diode of claim 12, said given wattage being not greater than 0.6 times the wattage necessary to produce said defined quantity of light from a light emitting diode having a noncomposite high work function inorganic ohmic hole-injecting layer electrode but being otherwise identical to the light-emitting diode of claim 12 and said given voltage being not greater than 0.6 times the voltage necessary to produce light from a light emitting diode having a noncomposite high work function inorganic ohmic hole-injecting layer electrode but being otherwise identical to the light emitting diode of claim 12 and
  (b) using said defined quantity of light.

33. A process for producing a defined quantity of light comprising
  (a) applying a given wattage at a given voltage across the composite ohmic hole-injecting layer electrode and the electron-injecting layer electrode of the light emitting diode of claim 26, said given wattage being not greater than 0.6 times the wattage necessary to produce said defined quantity of light from a light emitting diode having a noncomposite high work function inorganic ohmic hole-injecting layer electrode but being otherwise identical to the light-emitting diode of claim 26 and said given voltage being not greater than 0.6 times the voltage necessary to produce light from a light emitting diode having a noncomposite high work function inorganic ohmic hole-injecting layer electrode but being otherwise identical to the light emitting diode of claim 26 and
  (b) using said defined quantity of light.

* * * * *